US012644926B2

(12) United States Patent
Dou et al.

(10) Patent No.: US 12,644,926 B2
(45) Date of Patent: Jun. 2, 2026

(54) DATA SIMULATION APPARATUS AND DATA SIMULATION METHOD

(71) Applicant: INSTITUTE OF SEMICONDUCTORS, CHINESE ACADEMY OF SCIENCES, Beijing (CN)

(72) Inventors: Runjiang Dou, Beijing (CN); Jingyi Yu, Tianjin (CN); Nanjian Wu, Beijing (CN); Liyuan Liu, Beijing (CN); Jian Liu, Beijing (CN)

(73) Assignee: INSTITUTE OF SEMICONDUCTORS, CHINESE ACADEMY OF SCIENCES Beijing, China, Beijing (CN)

( * ) Notice: Subject to any disclaimer, the term of this patent is extended or adjusted under 35 U.S.C. 154(b) by 100 days.

(21) Appl. No.: 18/727,581

(22) PCT Filed: Feb. 25, 2022

(86) PCT No.: PCT/CN2022/077820
§ 371 (c)(1),
(2) Date: Jul. 9, 2024

(87) PCT Pub. No.: WO2023/159451
PCT Pub. Date: Aug. 31, 2023

(65) Prior Publication Data
US 2025/0164555 A1     May 22, 2025

(51) Int. Cl.
*G01R 31/3183* (2006.01)
*G01R 31/319* (2006.01)

(52) U.S. Cl.
CPC .............. *G01R 31/318314* (2013.01); *G01R 31/31905* (2013.01); *G01R 31/31908* (2013.01)

(58) Field of Classification Search
CPC ...... G01R 31/318314; G01R 31/31905; G01R 31/31908; G01R 31/3183; G01R 31/28; G06F 11/36
(Continued)

(56) References Cited

U.S. PATENT DOCUMENTS 6,195,772 B1 *   2/2001   Mielke ............. G01R 31/31907
                                                      714/724
6,973,043 B1   12/2005   Farooq
(Continued)

FOREIGN PATENT DOCUMENTS

CN       104820637 A     8/2015
CN       109947376 A     6/2019
(Continued)

OTHER PUBLICATIONS

International Search Report and Written Opinion issued for International Patent Application No. PCT/CN2022/077820, Date of mailing: Oct. 10, 2022, 10 pages including English translation of Search Report.
(Continued)

*Primary Examiner* — James C Kerveros
(74) *Attorney, Agent, or Firm* — HSML P.C.

(57)     ABSTRACT

A data simulation apparatus and a data simulation method are provided, and the apparatus includes: a programmable logic device configured to implement at least one interface protocol, so as to send and receive simulation data and test data respectively according to the at least one interface protocol, where the simulation data comprises first data and second data, and a transmission rate of the first data is lower than a transmission rate of the second data; at least one first interface configured to connect the programmable logic device and at least one first device under test, so as to transmit the first data and the test data; and/or, at least one (Continued)

second interface configured to connect the programmable logic device and at least one second device under test, so as to transmit the second data and the test data.

9 Claims, 3 Drawing Sheets

(58) Field of Classification Search
USPC ......................................................... 714/724
See application file for complete search history.

(56) References Cited

U.S. PATENT DOCUMENTS

| | | | | |
|---|---|---|---|---|
| 7,596,730 | B2 * | 9/2009 | Watanabe | ........ G01R 31/31919 |
| | | | | 714/724 |
| 2014/0253099 | A1 * | 9/2014 | Han | ....................... G01R 19/00 |
| | | | | 324/126 |
| 2016/0036684 | A1 * | 2/2016 | Jones | ................... H03K 5/1534 |
| | | | | 370/252 |
| 2018/0205621 | A1 | 7/2018 | Ungar et al. | |
| 2022/0163588 | A1 * | 5/2022 | Froelich | .......... G01R 31/31903 |

FOREIGN PATENT DOCUMENTS

| | | |
|---|---|---|
| CN | 110362058 A | 10/2019 |
| CN | 112584457 A | 3/2021 |
| CN | 113035267 A | 6/2021 |
| CN | 214704611 U | 11/2021 |

OTHER PUBLICATIONS

First Office Action issued for Chinese Patent Application No. 202210183292.1, dated May 17, 2024, 13 pages including English machine translation.

* cited by examiner

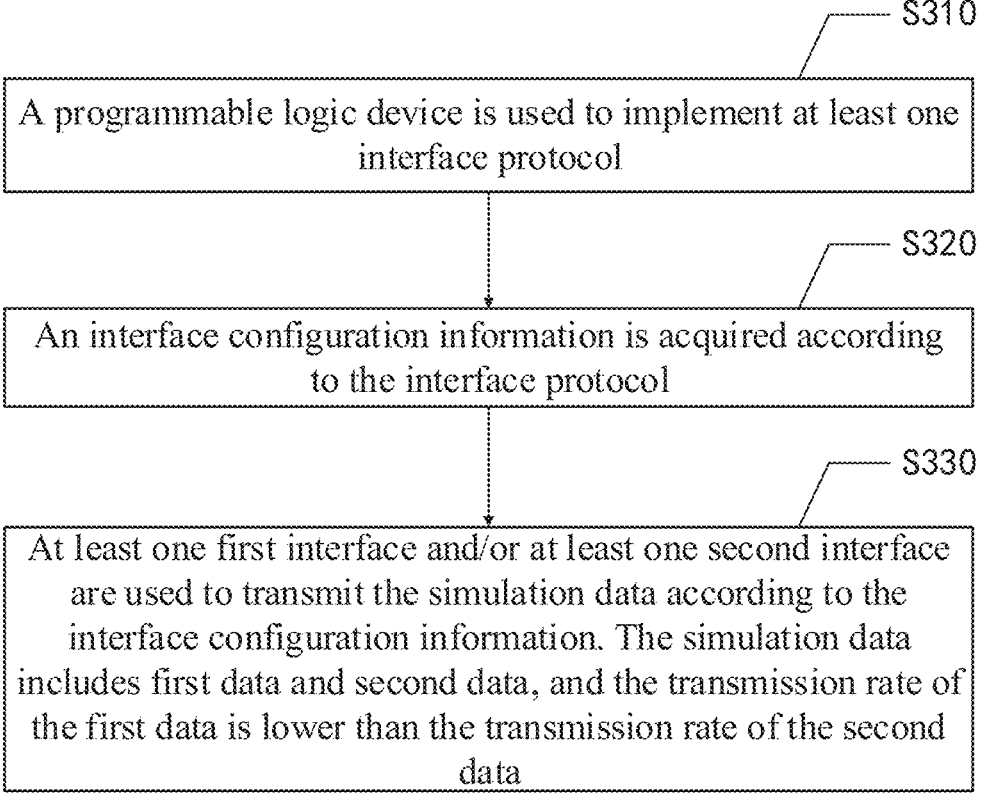

S310

A programmable logic device is used to implement at least one interface protocol

S320

An interface configuration information is acquired according to the interface protocol

S330

At least one first interface and/or at least one second interface are used to transmit the simulation data according to the interface configuration information. The simulation data includes first data and second data, and the transmission rate of the first data is lower than the transmission rate of the second data

FIG. 3

DATA SIMULATION APPARATUS AND DATA SIMULATION METHOD

CROSS-REFERENCE TO RELATED APPLICATION(S)

This application is a Section 371 National Stage Application of International Application No. PCT/CN2022/077820, filed on Feb. 25, 2022, entitled "DATA SIMULATION APPARATUS AND DATA SIMULATION METHOD", the content of which is incorporated herein by reference in its entirety.

TECHNICAL FIELD

The present disclosure relates to a field of computer communication technology, and in particular, to a data simulation apparatus and a data simulation method.

BACKGROUND

At present, large-scale complex visual processing systems in the fields of industrial vision, scientific research, etc. generally have control interfaces and data interfaces for different data protocols. The functional verification of each component of the system requires dedicated interface equipment for separate testing, which results in low efficiency of closed-loop verification of the system, and the entire verification process is very complex and unstable. For systems with interface synchronization and customizable data protocol requirements, it is even more difficult to meet the test requirements.

Therefore, a data simulation source system with rich types of high-speed and low-speed interfaces that may send and receive custom protocol data streams is needed, which may be widely used in the algorithm, hardware and architecture verification of visual processing systems in the fields of industrial vision, scientific research, etc.

SUMMARY

(I) Technical Problems to be Solved

In response to existing technical problems, the present disclosure provides a data simulation apparatus and a data simulation method for at least partially solving the above technical problems.

(II) Technical Solution

The present disclosure provides a data simulation apparatus, including: a programmable logic device configured to implement at least one interface protocol, so as to send and receive simulation data and test data respectively according to the at least one interface protocol, wherein the simulation data comprises first data and second data, and a transmission rate of the first data is lower than a transmission rate of the second data; at least one first interface configured to connect the programmable logic device and at least one first device under test, so as to transmit the first data and the test data; and/or, at least one second interface configured to connect the programmable logic device and at least one second device under test, so as to transmit the second data and the test data.

Optionally, the data simulation apparatus further includes: a disk array connected to the programmable logic device in communication and configured to store the simulation data and the test data; and a cache array connected to the programmable logic device in communication and configured to read and write data for the disk array; wherein the disk array comprises at least one disk, the disk comprises at least one sending channel sector and at least one receiving channel sector, the sending channel sector is configured to store the sent simulation data, and the receiving channel sector is configured to store the received test data; wherein the cache array comprises at least one cache element, the cache element comprises at least one sending channel buffer and at least one receiving channel buffer, the sending channel buffer is configured to read data from the sending channel sector, and the receiving channel buffer is configured to write data to the receiving channel sector; and wherein each of the first interface and the second interface is allocated with an independent sending channel sector and an independent receiving channel sector.

Optionally, the sending channel buffer and the receiving channel buffer use ping-pong cache.

Optionally, the programmable logic device includes an on-chip memory configured to read and write data for the cache array.

Optionally, the first interface comprises a low-voltage differential signaling interface, a universal asynchronous receiver/transmitter interface, and a CANBUS interface; and wherein the second interface comprises a TLK2711 interface and an Ethernet interface.

Optionally, the data simulation apparatus further includes: a PCIe bus configured to connect the programmable logic device and a client, so as to transmit the simulation data; wherein the programmable logic device is further configured to acquire a configuration information through the PCIe bus, so as to divide the sending channel sector and the receiving channel sector; wherein the disk further comprises: an independent configuration sector configured to store the configuration information; and wherein the cache element further comprises: an independent buffer configured to read and write data for the independent configuration sector.

Optionally, the programmable logic device is further configured to acquire a configuration register through the PCIe bus, so as to reset a first address of the sending channel sector or the receiving channel sector.

Optionally, the PCIe bus is connected to the client through a thunderbolt controller.

Optionally, the first interface or the second interface uses any one of single-frame synchronous mode, single-frame asynchronous mode, continuous synchronous mode and continuous asynchronous mode to transmit the simulation data.

In another aspect, the present disclosure provides a data simulation method, including: using a programmable logic device to implement at least one interface protocol; acquiring an interface configuration information according to the interface protocol; and using at least one first interface and/or at least one second interface to transmit simulation data according to the interface configuration information; wherein the simulation data comprises first data and second data, and a transmission rate of the first data is lower than a transmission rate of the second data.

(III) Beneficial Effects

The present disclosure provides a data simulation apparatus, by connecting a plurality of interfaces with different data transmission rates and different data transmission protocols to a programmable logic device and implementing a plurality of data transmission protocols on-chip corresponding to each interface on the programmable logic device, the simulation data communication with an external large-scale complex visual processing system through various interfaces may be implemented in a centralized and unified manner, which greatly improves the test efficiency of the external system.

The data simulation apparatus of the present disclosure further includes the cache array and the disk array, where each cache element and disk has independent buffers and independent sectors for the interfaces, so that each interface may send simulation data of each custom protocol in a synchronous or asynchronous manner.

BRIEF DESCRIPTION OF THE DRAWINGS

The above and other purposes, features and advantages of the present disclosure will become clearer through the following description of the embodiments of the present disclosure with reference to the drawings, wherein:

FIG. 3 schematically shows a flow chart of a data simulation method according to the embodiments of the present disclosure.

DETAILED DESCRIPTION OF EMBODIMENTS

Figure 1:
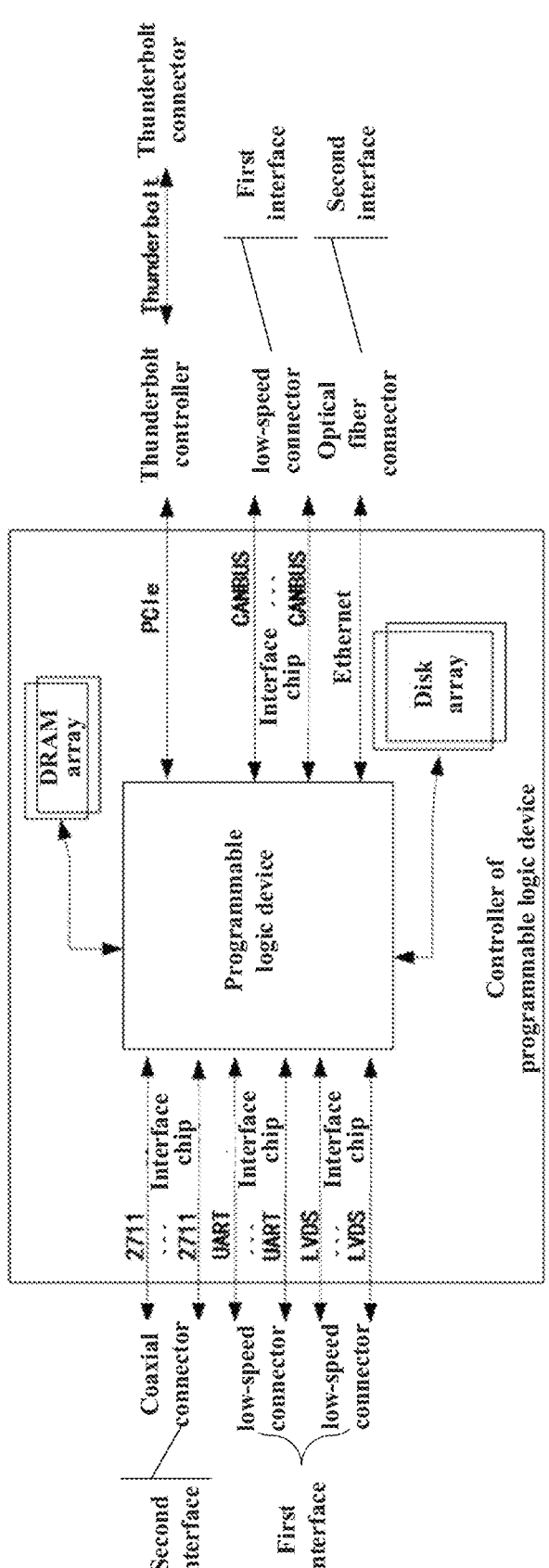
FIG. 1 schematically shows a structural diagram of a data simulation apparatus according to the embodiments of the present disclosure.

In order to make the objectives, technical solutions and advantages of the present disclosure more clearly understood, the present disclosure is further described in detail below in combination with specific embodiments and with reference to the drawings.

It should be noted that in the drawings or specification, similar or identical parts use the same reference signs. The technical features in the various embodiments exemplified in the specification may be freely combined to form a new solution without conflict, and each claim may be used as an embodiment alone or the technical features in each claim may be combined as a new embodiment. In the drawings, the shape or thickness of the embodiment may be enlarged and marked in a simplified or convenient way. Further, elements or implementations not shown or described in the drawings are known to those of ordinary skill in the art. In addition, although examples of parameters including specific values may be provided herein, it should be understood that the parameters need not be exactly equal to the corresponding values, but may be approximated to the corresponding values within an acceptable error tolerance or design constraint.

Unless there are technical obstacles or contradictions, the above-mentioned various embodiments of the present disclosure may be freely combined to form additional embodiments, and these additional embodiments are all within the scope of protection of the present disclosure.

Although the present disclosure is described in conjunction with the drawings, the embodiments disclosed in the drawings are intended to illustrate the embodiments of the present disclosure and may not be understood as a limitation of the present disclosure. The size ratios in the drawings are merely schematic and may not be understood as limitations of the present disclosure.

Although some embodiments of the overall concept of the present disclosure have been shown and described, those skilled in the art will understand that changes may be made to these embodiments without departing from the principles and spirit of the overall concept of the present disclosure, and the scope of the present disclosure is defined by the claims and their equivalents.

FIG. 1 schematically shows a structural diagram of a data simulation apparatus according to the embodiments of the present disclosure.

According to the embodiments of the present disclosure, as shown in FIG. 1, a data simulation apparatus, which may also be referred to as a data simulation source, includes, for example: a programmable logic device configured to implement at least one interface protocol, so as to send and receive simulation data and test data respectively according to the interface protocol, wherein the simulation data comprises first data and second data, and a transmission rate of the first data is lower than a transmission rate of the second data; at least one first interface configured to connect the programmable logic device and at least one first device under test, so as to transmit the first data and the test data; and/or, at least one second interface configured to connect the programmable logic device and at least one second device under test, so as to transmit the second data and the test data. The simulation data is, for example, data sent by the data simulation apparatus to each device under test, and the test data is, for example, result data fed back to the data simulation apparatus by each device under test. A transmission rate attribute of the test data is consistent with a transmission rate attribute of the simulation data of the corresponding interface. The first data is, for example, low-speed data, and the first interface is, for example, a low-speed interface. The low-speed interface connects the programmable logic device with an external system, such as a low-speed data interface of a large-scale complex visual processing system. By implementing the corresponding low-speed data transmission protocol on-chip on the programmable logic device, the data simulation apparatus may mutually transmit low-speed data of different low-speed data transmission protocols with the external system. Similarly, the second data is, for example, high-speed data, and the second interface is, for example, a high-speed interface. The high-speed interface connects the programmable logic device with an external system, such as a high-speed data interface of a large-scale complex visual processing system. By implementing the corresponding high-speed data transmission protocol on-chip on the programmable logic device, the data simulation apparatus may mutually transmit high-speed data of different high-speed data transmission protocols with the external system. The programmable logic device may, for example, implement protocols such as protocols of DDR3 controller, PCIe 2.0 bus, SATA 3.0, 10 Gigabit Ethernet and CANBUS 2.0B controller and custom protocols on chip. The first device under test is, for example, a device in an external system that generates or uses low-speed data, and the second device under test is, for example, a device in an external system that generates or uses high-speed data.

It is understandable that the programmable logic device in the present disclosure may be any programmable logic device that may implement a custom data transmission protocol and multi-interface data communication on-chip, such as a field programmable gate array (FPGA) and a complex programmable logic device (CPLD).

According to the embodiments of the present disclosure, as shown in FIG. 1, the first interface and the second interface, for example, respectively represent a type of interface, that is, the first interface, for example, is a low-speed interface for transmitting low-speed data, and the second interface, for example, is a high-speed interface for transmitting high-speed data. The first interface, for example, may be a Low-Voltage Differential Signaling (LVDS) interface, a Universal Asynchronous Receiver/ Transmitter (UART) interface, and a CANBUS interface, etc. The second interface, for example, includes a TLK2711 interface and an Ethernet interface, etc. Each interface, for example, is in a working mode in which an interface chip drives a corresponding connector. For example, for an LVDS interface, a LVDS interface chip drives a low-speed connector to perform low-speed data transmission with an external system, and for a TLK2711 interface, a TLK2711 interface chip drives a coaxial connector to perform high-speed data transmission with an external system. The Ethernet interface, for example, directly performs high-speed data transmission with an external system through an optical fiber connector. The Ethernet interface, for example, is suitable for 100 M Ethernet, Gigabit Ethernet, 10G Ethernet, 40G and higher bandwidth Ethernet, etc. The first interface or the second interface may, for example, transmit analog data in any one of single-frame synchronous, single-frame asynchronous, continuous synchronous and continuous asynchronous modes.

In one embodiment, the data simulation apparatus includes, for example, two LVDS physical layer driving circuits, which respectively implement one three-wire LVDS interface and one two-wire LVDS interface; three UART physical layer driving circuits, which respectively implement one external trigger signal interface, one synchronous RS422 and five asynchronous RS422 interfaces; one CANBUS physical layer driving circuit, which implements one CANBUS interface; and three TLK2711 driving circuits, which implement three 2711 high-speed serial transceiver interfaces.

It is understandable that the number of driving circuits and the number of interfaces may be set according to the data transmission needs of the external system, and the present disclosure does not specifically limit it.

Figure 2:
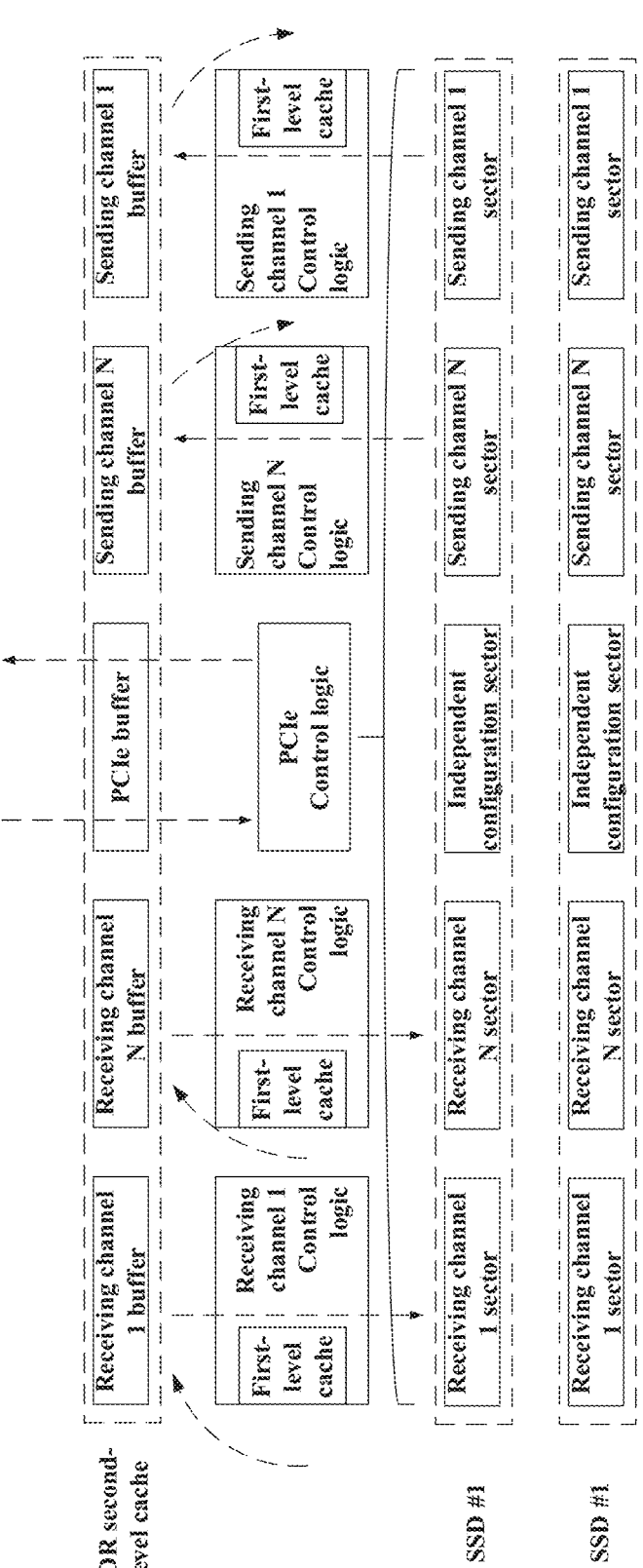
FIG. 2 schematically shows a storage structural diagram of a data simulation apparatus according to the embodiments of the present disclosure.

FIG. 2 schematically shows a storage structural diagram of a data simulation apparatus according to the embodiments of the present disclosure.

According to the embodiments of the present disclosure, the data simulation apparatus further includes: a disk array, connected to the programmable logic device in communication and used to store the simulation data and the test data. After the system is disconnected and the power supply is stopped, due to the non-volatility of the disk array, the simulation data may not be lost and may be used for the next simulation. When simulating a large amount of data for a long time, the disk array may ensure the stability of data output simulation and input storage. A cache array is connected to the programmable logic device in communication and is used to read and write data for the disk array. The cache array may be, for example, a DRAM array. As shown in FIG. 2, the disk array includes at least one disk, which is, for example, an SSD. The SSD may be, for example, a SATA or an NVME. The disk includes at least one sending channel sector and at least one receiving channel sector, the sending channel sector is used to store the sent simulation data, and the receiving channel sector is used to store the received test data. The cache array includes at least one cache element, which may be, for example, a DDR particle or a DDR memory bar. Each cache element includes at least one sending channel buffer and at least one receiving channel buffer. The sending channel buffer is used to read data from the sending channel sector, and the receiving channel buffer is used to write data to the receiving channel sector. Each of the first interface and the second interface is allocated with an independent sending channel sector and an independent receiving channel sector. For example, the TLK2711 interface may be divided into a sending channel and a receiving channel according to the data transmission direction. When sending data from the data simulation apparatus, the TLK2711 sending channel corresponds to an independent sending channel buffer and an independent sending channel sector, such as a sending channel 1 buffer and a sending channel 1 sector. The LVDS sending channel may correspond to a sending channel 2 buffer and a sending channel 2 sector, for example. Similarly, the data simulation apparatus allocates an independent sending channel buffer and an independent sending channel sector to each interface. The external system may, for example, provide data to be simulated and return test result data to the data simulation apparatus. When receiving data from the external system, the TLK2711 receiving channel may, for example, correspond to a receiving channel 1 buffer and a receiving channel 1 sector. The LVDS receiving channel may, for example, correspond to a receiving channel 2 buffer and a receiving channel 2 sector. Similarly, the data simulation apparatus also allocates an independent receiving channel buffer and an independent receiving channel sector to each interface. Besides, since the storage structure is, for example, a disk array and the cache structure is, for example, a cache array, the effective data transmission bandwidth of the same interface may be improved. For example, the TLK2711 sending channel corresponds to two sending channel 1 buffers and two sending channel 1 sectors, which may improve the effective data transmission bandwidth of the TLK2711 sending channel.

It is understandable that the number of disks and cache elements is determined, for example, according to the data bandwidth requirements of each interface. The number of sending channel sectors and receiving channel sectors is determined, for example, according to the number of interfaces, and the present disclosure does not specifically limit this.

According to the embodiments of the present disclosure, a programmable logic device includes, for example, an on-chip memory configured to read and write data for the cache array. The cache array and the on-chip memory constitute a two-level cache structure, which implements a two-level cache for reading and writing data from the disk array. As shown in FIG. 2, the on-chip memory is, for example, a first-level cache, and the cache element (constituting a cache array) is, for example, a DDR second-level cache. When sending data to an external system, the data simulation apparatus may first read the data from the disk array into the DDR second-level cache, then move the data from the DDR second-level cache to the first-level cache, and finally read the data from the first-level cache and send the data according to the protocol. Since the data of the interfaces may be transmitted in a synchronous transmission manner, it is necessary to cache a complete data frame or data packet in the buffer, so the sending timing of each data frame or data packet may be adjusted through the two-level cache structure, thereby ensuring the synchronous sending of the data of each interface. Similarly, when receiving data from an external system, the data simulation apparatus may first store the data in the first-level cache, then move the data from the first-level cache to the DDR second-level cache, and finally store the data from the DDR second-level cache into the disk array. The two-level cache structure may also adjust the reception timing of each data frame or data packet, thereby ensuring the correct protocol analysis of the data received by each interface and the integrity of the data.

Preferably, the on-chip memory and the DDR secondary cache may, for example, both cache data in a ping-pong cache manner. The ping-pong cache manner further improves the efficiency of data transmission.

According to the embodiments of the present disclosure, the data simulation apparatus, for example, further includes: a PCIe (PCI-Express) bus for connecting the programmable logic device and a client, to transmit the simulation data. The data simulation apparatus of the present disclosure may be directly connected to a computer motherboard separately, mounted and used through a PCIe bus, and implements communication with application management software. The programmable logic device is further used to acquire a configuration information through the PCIe bus to divide the sending channel sector and the receiving channel sector. The disk further includes: an independent configuration sector for storing the configuration information. Each cache element further includes: an independent buffer to read and write data for the independent configuration sector. The data simulation apparatus is connected to the client, for example, through the PCIe bus. The client sets the configuration information of each interface through application software according to each interface protocol, so that data may be transmitted through each interface according to the protocol. The configuration information includes, for example, parameters such as the storage partition size, starting position, data frame size, frame interval, and data download and upload path of each data sending channel or receiving channel. The programmable logic device has PCIe control logic, which may control the data simulation apparatus to store the configuration information in the PCIe buffer through the PCIe bus, and then further store the configuration information in the independent configuration sector inherent in the disk. When the data simulation apparatus is powered on again, the application software may automatically read back the configuration and display the configuration through the PCIe bus. If the configuration information needs to be changed, after the software is set, the new configuration information will be updated into the independent configuration sector.

Preferably, the PCIe bus may be connected to the client through a thunderbolt controller, that is, the data simulation apparatus of the present disclosure may also communicate with the application management software through the thunderbolt interface. In this embodiment, the data simulation apparatus includes, for example, a thunderbolt controller to implement the thunderbolt interface communication with the computer and the PCIe bus protocol conversion between the computer and the programmable logic device. The data simulation apparatus may be connected to a laptop computer through a thunderbolt connector, which improves the portability of the device.

According to the embodiments of the present disclosure, the programmable logic device is also used to acquire a configuration register through the PCIe bus to reset the first address of the sending channel sector or the receiving channel sector. Resetting the first address may determine the timing of data transfer and re-divide the sector. After the data stored in the memory sector is sent or the application software clicks to restore the sector first address, the control logic returns to the sector first address to start transferring data.

FIG. 3 schematically shows a flow chart of a data simulation method according to the embodiments of the present disclosure.

According to the embodiments of the present disclosure, as shown in FIG. 3, the data simulation method includes, for example:

S310, a programmable logic device is used to implement at least one interface protocol.

According to the embodiments of the present disclosure, before starting to transmit simulation data, the data simulation apparatus communicates with the application management software of the computer, for example, through a PCIe bus, or communicates with the computer through a thunderbolt interface. The application management software connects to the data simulation apparatus and checks the hardware information status of the apparatus.

S320, an interface configuration information is acquired according to the interface protocol.

According to the embodiments of the present disclosure, according to the data type and transmission rate requirement of each interface for transmission, the disk occupied sector head address and capacity size of each interface channel of the data simulation apparatus may be read back or configured through the application management software, and the remaining space may be displayed.

S330, at least one first interface and/or at least one second interface are used to transmit the simulation data according to the interface configuration information. The simulation data includes first data and second data, and the transmission rate of the first data is lower than the transmission rate of the second data.

According to the embodiments of the present disclosure, by selecting the path where the file is located, the data of each sending channel is downloaded to the configured sector space. According to the protocol requirements, the frame header, frame size, frame interval, mode, delay and other parameters required by the interface for sending data are set. Besides, the working mode of each sending channel may also be set by software. In the external trigger activation mode, each sending channel controls the sending of data and stopping of the data transmission according to the set working parameters by the external trigger signal. In the external trigger deactivation mode, the software controls the sending of data and the stopping of data transmission. The data sending and receiving behaviors of each interface channel are independent of each other, and the software may display the sending and receiving data information of each interface. Each time data sending or data receiving is started, the sending and receiving of data of each channel are, for example, continuous reading and writing of defined disk sectors. Each sending channel reads the data in its sector and sends it out according to the set working parameters. Each receiving channel receives data in real time, and the data is saved in the set sector space. The software sets the format and path of the saved file and uploads the data in the sector space to the local computer. The software also supports the reset of the starting sector address of the sending and receiving interface channels respectively. After reset, the sending channel starts sending data from the first address of each sector, and the receiving channel starts storing data from the first address of each sector.

According to the embodiments of the present disclosure, the simulation data of the present disclosure includes, for example, data to be simulated downloaded from the PC end and high-speed and low-speed data input from the external system. The data to be simulated may be input into the data simulation apparatus through the client (PC), and then input into the external system from the data simulation apparatus. The high-speed and low-speed data may also be input into the data simulation apparatus from the external system, and then uploaded from the data simulation apparatus to the client. The specific process of data transmission is shown in FIG. 2. The application software first downloads the data to be simulated through the PCIe bus, and the PCIe control logic of the data simulation apparatus writes the data to be simulated into the PCIe buffer (8 MB) opened in DDR3 (8 Gb, x64, 1333M) through XDMA operation, and then DMA write operation from DDR to SATA is performed to write the data to be simulated into the SATA.

When the data simulation apparatus receives an external trigger signal or the application software clicks to start sending, the control logic of each sending channel, such as the TLK2711 sending channel, performs a SATA DMA read operation (16 MB), and reads data blocks from the sector of the sending channel in sequence to DDR buffer (32 MB) of the sending channel. The buffer adopts a ping-pong operation mode of 16 MB each, and whenever the data is filled, the data will be moved to the first-level buffer (128 KB) inside the control logic of the programmable logic device. Whenever the amount of data in the first-level buffer is less than 64 KB, the control logic may start a 16 KB DMA operation to move data from the DDR buffer to the first-level buffer. Next, the control logic reads data from the first-level buffer and sends data to the external system according to the protocol and according to the configuration information set by the application software. When the external trigger signal disappears or the application software clicks to stop sending, the control logic will stop sending data after sending a complete protocol frame data, and the sector address remains unchanged at the current value.

When data is input from an external system to the data simulation apparatus, each receiving channel of the data simulation apparatus, such as the TLK2711 receiving channel, analyzes in real time and writes the correct data into the primary buffer (512 KB) in the control logic first according to the configuration information set by the application software. When the amount of data in the primary buffer exceeds 16 KB, the control logic moves the data to DDR buffer (32 MB) of the receiving channel. The buffer adopts a ping-pong operation mode of 16 MB each. When the 16 MB data in the ping buffer is full, the control logic starts DMA to write the 16 MB data sequentially into its SATA sector. The ping-pong buffer alternates and writes the data into the SATA in real time. Each receiving channel will parse the correct data according to the protocol according to the configuration information set by the application software and write it into its sector space in real time and in sequence. If the control logic does not detect the data, the sector write address remains unchanged at the current value. As required, the application software can set the recovery of sector head address.

When data is uploaded from the data simulation apparatus to the client, data amount and storage format of the data stored in the SATA of each channel is set by the application software. For example, if the TLK2711 receiving channel is requested to upload 500 MB of data, the number of files may be set to 1 and the size of a single file may be set to 500 MB, or the number of files may be set to 5 and the size of a single file may be set to 100 MB.

In summary, the embodiments of the present disclosure provide a data simulation apparatus and a data simulation method. By connecting a plurality of interfaces with different data transmission rates and different data transmission protocols to a programmable logic device and implementing a plurality of data transmission protocols on-chip corresponding to each interface on the programmable logic device, the simulation data communication with an external large-scale complex visual processing system through various interfaces may be implemented in a centralized and unified manner, which greatly improves the test efficiency of the external system. The data simulation apparatus of the present disclosure may implement data transmission, reception and real-time storage of each channel data interface of different application layer protocols, and may be widely used in robotics, industrial vision, scientific research and other fields.

The details in the method embodiment section are similar to those in the apparatus embodiment section. Please refer to the apparatus embodiment section and will not be repeated here.

It should be understood that the specific order or hierarchy of steps in the disclosed process is an example of an exemplary method. Based on design preferences, it should be understood that the specific order or hierarchy of steps in the process may be rearranged without departing from the scope of protection of the present disclosure. The attached method claims give the elements of various steps in an exemplary order and are not intended to be limited to a specific order or hierarchy.

It should also be noted that the directional terms mentioned in the embodiments, such as "up", "down", "front", "back", "left", "right", etc., are only referenced to the directions of the drawings and are not intended to limit the scope of protection of the present disclosure. Throughout the drawings, the same elements are represented by the same or similar figure marks. Conventional structures or constructions will be omitted when they may cause confusion in the understanding of the present disclosure. The shapes, sizes, and positional relationships of the components in the figures do not reflect the actual size, proportion, and actual positional relationship.

In the above detailed description, various features are grouped together in a single embodiment to simplify the present disclosure. This method of disclosure should not be interpreted as reflecting an intention that the embodiments of the claimed subject matter require more features than those clearly stated in each claim. On the contrary, as reflected in the attached claims, the present disclosure is in a state of less than all the features of the disclosed single embodiment. Therefore, the attached claims are hereby expressly incorporated into the detailed description, with each claim acting alone as a separate preferred embodiment of the present disclosure.

In addition, the terms "first" and "second" are used only for descriptive purposes and cannot be understood as indicating or implying relative importance or implicitly indicating the number of technical features indicated. Therefore, the features defined as "first" and "second" may explicitly or implicitly include one or more of the features. In the description of the present disclosure, "plurality" means at least two, such as two, three, etc., unless otherwise clearly and specifically defined. The term "containing" as used in the specification or claims is intended to be inclusive in a manner similar to the term "including" as interpreted when used as a transitional term in claim. Any use of the term "or" in the specification of the claims is intended to mean a "non-exclusive or".

The specific embodiments described above further illustrate the purpose, technical solutions and beneficial effects of the present disclosure. It should be understood that the above description is only a specific embodiment of the present disclosure and is not intended to limit the present disclosure. Any modifications, equivalent substitutions, improvements, etc. made within the spirit and principles of the present disclosure should be included in the protection scope of the present disclosure.

What is claimed is:

1. A data simulation apparatus, comprising:

a programmable logic device configured to implement at least one interface protocol, to send and receive simulation data and test data respectively according to the at least one interface protocol, wherein the simulation data comprises first data and second data, and a transmission rate of the first data is lower than a transmission rate of the second data;

at least one first interface configured to connect the programmable logic device and at least one first device under test, to transmit the first data and the test data;

at least one second interface configured to connect the programmable logic device and at least one second device under test, so as to transmit the second data and the test data, a disk array connected to the programmable logic device in communication and configured to store the simulation data and the test data; and a cache array connected to the programmable logic device in communication and configured to read and write data for the disk array;

wherein the disk array comprises at least one disk, the disk comprises at least one sending channel sector and at least one receiving channel sector, the sending channel sector is configured to store the sent simulation data, and the receiving channel sector is configured to store the received test data;

wherein the cache array comprises at least one cache element, the cache element comprises at least one sending channel buffer and at least one receiving channel buffer, the sending channel buffer is configured to read data from the sending channel sector, and the receiving channel buffer is configured to write data to the receiving channel sector; and wherein each of the first interface and the second interface is allocated with an independent sending channel sector and an independent receiving channel sector.

2. The data simulation apparatus according to claim 1, wherein the sending channel buffer and the receiving channel buffer use ping-pong cache.

3. The data simulation apparatus according to claim 1, wherein the programmable logic device comprises an on-chip memory configured to read and write data for the cache array.

4. The data simulation apparatus according to claim 1, wherein the first interface comprises a low-voltage differential signaling interface, a universal asynchronous receiver/transmitter interface, and a CANBUS interface; and wherein the second interface comprises a TLK2711 interface and an Ethernet interface.

5. The data simulation apparatus according to claim 1, further comprising:

a PCIe bus configured to connect the programmable logic device and a client, so as to transmit the simulation data;

wherein the programmable logic device is further configured to acquire configuration information through the PCIe bus, so as to divide the sending channel sector and the receiving channel sector;

wherein the disk further comprises:

an independent configuration sector configured to store the configuration information; and wherein the cache element further comprises:

an independent buffer configured to read and write data for the independent configuration sector.

6. The data simulation apparatus according to claim 5, wherein the programmable logic device is further configured to acquire a configuration register through the PCIe bus to reset a first address of the sending channel sector or the receiving channel sector.

7. The data simulation apparatus according to claim 5, wherein the PCIe bus is connected to the client through a thunderbolt controller.

8. The data simulation apparatus according to claim 1, wherein the first interface or the second interface uses any one of single-frame synchronous mode, single-frame asynchronous mode, continuous synchronous mode and continuous asynchronous mode to transmit the simulation data.

9. A data simulation method, comprising:

using a programmable logic device to implement at least one interface protocol;

acquiring an interface configuration information according to the interface protocol;

using at least one first interface and at least one second interface to transmit simulation data and test data according to the interface configuration information; and reading and writing on the simulation data and test data using a cache array and a disk array;

wherein the simulation data comprises first data and second data, and a transmission rate of the first data is lower than a transmission rate of the second data, wherein the disk array comprises at least one disk, the disk comprises at least one sending channel sector and at least one receiving channel sector, the sending channel sector is configured to store the sent simulation data, and the receiving channel sector is configured to store the received test data;

wherein the cache array comprises at least one cache element, the cache element comprises at least one sending channel buffer and at least one receiving channel buffer, the sending channel buffer is configured to read data from the sending channel sector, and the receiving channel buffer is configured to write data to the receiving channel sector; and wherein each of the first interface and the second interface is allocated with an independent sending channel sector and an independent receiving channel sector.

* * * * *